(12) United States Patent
Baek

(10) Patent No.: US 8,456,000 B2
(45) Date of Patent: Jun. 4, 2013

(54) SEMICONDUCTOR MODULE AND AN ELECTRONIC SYSTEM INCLUDING THE SAME

(75) Inventor: Joong-Hyun Baek, Suwon-si (KR)

(73) Assignee: Stanzione & Kim, LLP, Suwon-si (KR)

( * ) Notice: Subject to any disclaimer, the term of this patent is extended or adjusted under 35 U.S.C. 154(b) by 633 days.

(21) Appl. No.: 12/554,173

(22) Filed: Sep. 4, 2009

(65) Prior Publication Data

US 2010/0059880 A1  Mar. 11, 2010

(30) Foreign Application Priority Data

Sep. 9, 2008 (KR) ........................ 10-2008-0088880

(51) Int. Cl.
| | | |
|---|---|---|
| *H01L 23/02* | (2006.01) | |
| *H01L 23/053* | (2006.01) | |
| *H01L 23/12* | (2006.01) | |
| *H01L 23/34* | (2006.01) | |
| *H01L 23/04* | (2006.01) | |
| *H02B 1/00* | (2006.01) | |
| *H05K 7/00* | (2006.01) | |
| *H05K 1/00* | (2006.01) | |
| *H05K 1/18* | (2006.01) | |
| *H05K 1/11* | (2006.01) | |
| *H05K 1/14* | (2006.01) | |

(52) U.S. Cl.
USPC ............ 257/724; 257/678; 257/685; 257/701; 257/704; 257/730; 257/E23.001; 361/600; 361/728; 361/748; 361/749; 361/784

(58) Field of Classification Search
USPC ................. 257/678, 686, 704, 706, 712, 723, 257/724, 730, E23.036, E23.08, 685, 701, 257/E23.001; 361/730, 749, 600, 728, 736, 361/748, 760, 784
See application file for complete search history.

(56) References Cited

U.S. PATENT DOCUMENTS

| | | | | |
|---|---|---|---|---|
| 5,362,986 | A * | 11/1994 | Angiulli et al. | ............... 257/723 |
| 5,963,427 | A * | 10/1999 | Bollesen | ....................... 361/704 |
| 6,532,157 | B1 * | 3/2003 | Glenn et al. | .................. 361/767 |
| 6,952,352 | B2 | 10/2005 | Emma et al. | |
| 7,012,812 | B2 * | 3/2006 | Haba | ............................. 361/792 |
| 7,230,334 | B2 | 6/2007 | Andry et al. | |
| 2004/0057214 | A1 * | 3/2004 | Alcoe et al. | ................... 361/719 |
| 2005/0087862 | A1 * | 4/2005 | Shiomi et al. | ................. 257/704 |
| 2005/0133250 | A1 * | 6/2005 | Baba | ............................. 174/254 |
| 2007/0096294 | A1 * | 5/2007 | Ikeda et al. | ................... 257/704 |
| 2008/0079141 | A1 * | 4/2008 | Tien et al. | ..................... 257/704 |
| 2008/0117593 | A1 * | 5/2008 | Andric et al. | ................. 361/697 |
| 2008/0174006 | A1 * | 7/2008 | Fuchinoue | .................... 257/704 |

FOREIGN PATENT DOCUMENTS

JP  10-163660  6/1998

* cited by examiner

*Primary Examiner* — Teresa M Arroyo
(74) *Attorney, Agent, or Firm* — Stanzione & Kim, LLP

(57) ABSTRACT

A three-dimensional semiconductor module and an electronic system including the same are provided. The semiconductor module includes a module substrate, a logic device formed on a part of the module substrate, and a plurality of memory devices formed on another part of the module substrate, wherein the plurality of memory devices are disposed perpendicular to the logic device, and the module substrate on which the plurality of memory devices are formed is supported by a supporter. The electronic system includes the semiconductor module.

11 Claims, 17 Drawing Sheets

SEMICONDUCTOR MODULE AND AN ELECTRONIC SYSTEM INCLUDING THE SAME

CROSS-REFERENCE TO RELATED APPLICATIONS

This application claims priority under 35 U.S.C. §119(a) from Korean Patent Application No. 10-2008-0088880, filed Sep. 9, 2008, the contents of which are hereby incorporated herein by reference in their entirety.

BACKGROUND

1. Field of the Invention

The present general inventive concept relates to a semiconductor module, and, in particular, to a semiconductor module including a logic device and a memory device, and an electronic system including the same.

2. Description of the Related Art

Some universally accepted aspects about the development of next generation semiconductor devices include that they will be high in speed, compact in size, low in power consumption, and large in capacity. Along those lines, a multi chip package (MCP) has been receiving remarkable attention together with a system in a package (SIP). These techniques are being researched because they do not significantly depart from conventional semiconductor techniques, and thus superior effects may be obtained. However, research into a single semiconductor chip or semiconductor package may not facilitate solving problems of a semiconductor device on a system level. That is, future development of the semiconductor technology on the system level may be difficult to envision. Therefore, there may be a difficulty in further developing the performance of the semiconductor device.

SUMMARY

Exemplary embodiments of the present general inventive concept provide a semiconductor module to reduce a signal transmission path between a logic device and a memory device, and to improve cooling efficiency, so that performance and integration density of a circuit can be enhanced.

Additional features and utilities of the present general inventive concept will be set forth in part in the description which follows and, in part, will be obvious from the description, or may be learned by practice of the general inventive concept.

Example embodiments of the present general inventive concept also provide an electronic system including a semiconductor module, so that performance and integration density of the system can be improved.

The present general inventive concept will not be limited to the descriptions thereof, and alternative embodiments which will not be described herein will be clearly understood by those of ordinary skill in the art with reference to the following descriptions.

Exemplary embodiments of the present general inventive concept may be achieved by providing a semiconductor module that includes a module substrate, a logic device formed on a part of the module substrate, and a plurality of memory devices formed on another part of the module substrate, where the plurality of memory devices are disposed perpendicular to the logic device, and the module substrate on which the plurality of memory devices are formed is supported by a supporter.

Exemplary embodiments of the present general inventive concept may also be achieved by providing an electronic system that includes a main circuit board, and a semiconductor module formed on the main circuit board. The semiconductor module includes a module substrate, a logic device formed on a part of the module substrate, and a plurality of memory devices formed on another part of the module substrate, where the plurality of memory devices are disposed perpendicular to the logic device, and the module substrate on which the plurality of memory devices are formed is supported by a supporter.

Exemplary embodiments of the present general inventive concept also provide a semiconductor module having a connection unit to connect to an electronic circuit board, the semiconductor module including a module substrate, a logic device disposed on a first surface of the module substrate, a plurality of memory devices disposed on at least second surface opposite the first surface of the module substrate, and at least one supporter on the first surface of the module substrate to support at least a portion of the module substrate.

Exemplary embodiment of the present general inventive concept also provide an electronic system, including an electronic circuit board, a connection unit disposed on the electronic circuit board, a semiconductor module connected to the connection unit, having a module substrate, a logic device disposed on a first surface of the module substrate, a plurality of memory devices disposed on at least a second surface opposite the first surface of the module substrate, and at least one supporter on the first surface of the module substrate to support at least a portion of the module substrate.

Other example embodiments will be described with reference to the detailed descriptions and the accompanying drawings.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1A:
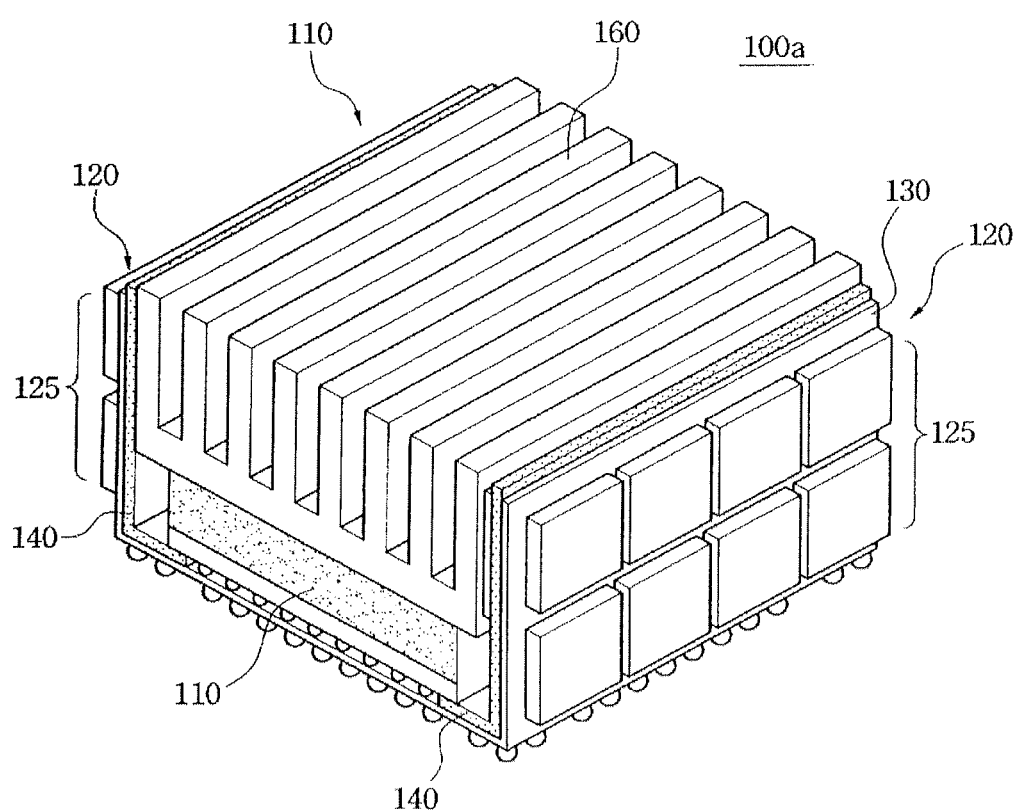
FIGS. 1A and 1B are plan views illustrating semiconductor modules of exemplary embodiments of the present general inventive concept.

Various example embodiments will now be described more fully with reference to the accompanying drawings in which example embodiments are illustrated. This inventive concept may, however, be embodied in different forms and should not be construed as limited to the embodiments set forth herein. These embodiments are provided to ensure that this disclosure is thorough and fully enables those skilled in the art to embody and practice the inventive concept. In the drawings, the thicknesses of layers and regions may be exaggerated for clarity. It will also be understood that when a layer is referred to as being "on" another layer or substrate, it can be directly on the other layer or substrate or intervening layers may also be present. Throughout the drawings, like elements are denoted by like reference numerals.

Example embodiments of the present general inventive concept will be described with reference to plan views and cross-sectional views illustrating the present general inventive concept. Therefore, the exemplified drawings may vary according to a fabrication technique and/or an allowable error. Therefore, the example embodiments of the present general inventive concept are not limited to a specific shape, but include a change in shape that is caused according to a fabrication process. Accordingly, regions illustrated in the drawing are schematic, and the shapes thereof exemplify a specific shape of a device, but are not limited thereto.

Exemplary embodiments of the present general inventive concept as discussed throughout provide improvements of the performance of a semiconductor module on a system level. Electronic systems include a system analyzing and processing an input signal and outputting an output signal as well as a personal computer, a high performance computer and a server. Electronic systems may include a logic device and a memory device, and the devices are modularized in the electronic system to be included therein. For example, the personal computer includes a central processing unit, a main memory, a graphic processor and a graphic memory. While a signal processing speed of each semiconductor device exceeds several tens of GHz, a transmission/reception speed of the signal is still typically in a unit of MHz. Unlike improving the signal processing speed of the semiconductor device, the signal transmission speed of the system requires characteristics of various electronic devices electrically connected to the system to be analyzed and determined, and load and impedance of each connected point to be improved, which makes the procedures very complicated and difficult.

In exemplary embodiments of the present general inventive concept described herein, a semiconductor module and an electronic system in which a physical distance between the logic device and the memory device is reduced to shorten a path in which an electrical signal is transmitted, an area taken by a module is reduced, cooling efficiency of a semiconductor device is enhanced, and the electronic system can be easily assembled. Therefore, the semiconductor module and the electronic system of the present general inventive concept have high-performance and low manufacturing costs.

As used herein, a structure in which the logic device and the memory device are combined with each other is referred to as a semiconductor module for clarity.

As used throughout, when comparing functions of elements illustrated in each drawing with those described in other example embodiments, the elements will not described unless they are particularly different. In the description of each example embodiment, when an illustrated element is not described in the relevant drawing, the element may be understood with reference to the similar element illustrated in the drawing in another example embodiment and the description thereof.

The example embodiments of the present general inventive concept described herein may be independently applied. One or more of the example embodiments can be compatible with each other, and one or more of the example embodiments can be simultaneously applied.

Various example embodiments of the present general inventive concept will now be described with reference to the accompanying drawings.

Figure 1B:
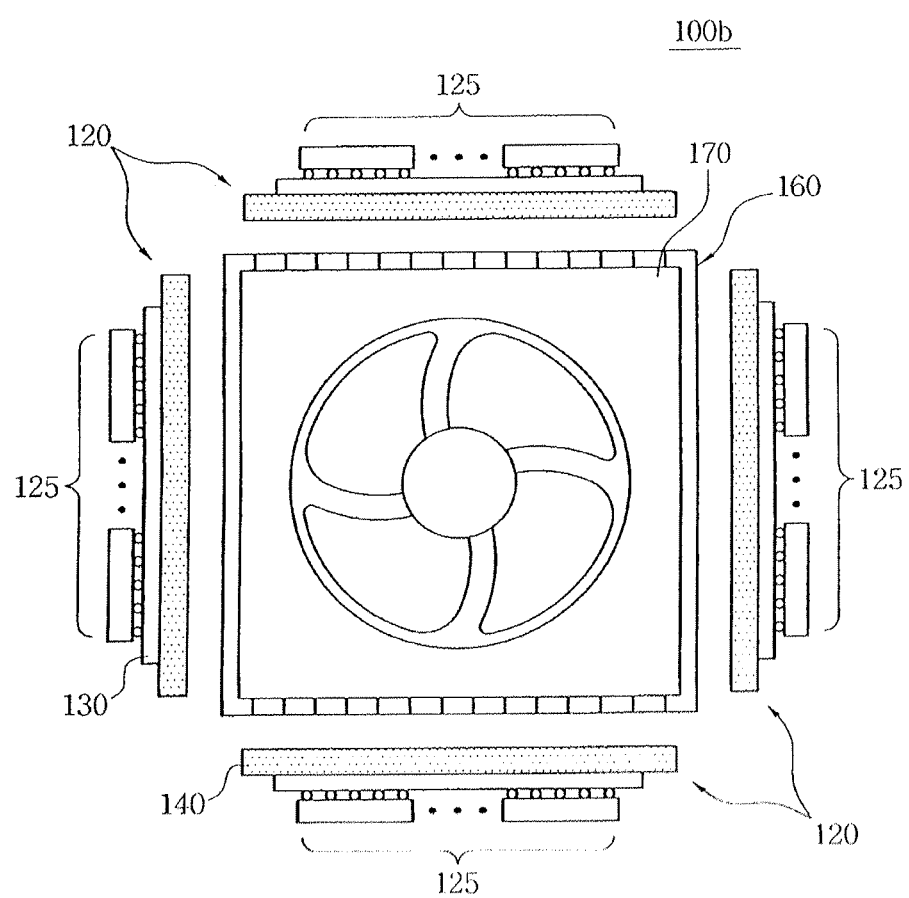

FIGS. 1A and 1B are plan views illustrating semiconductor modules 100a and 100b of exemplary embodiments of the present general inventive concept. Referring to FIG. 1A, a semiconductor module 100a according to the present general inventive concept includes a logic device 110 and memory modules 120 formed at a first and a second side (e.g., left and right sides) of the logic device 110. More specifically, as illustrated in FIG. 1A, the memory modules 120 are spaced from or are in contact with each first and second side (e.g., left and right side) of the logic device 110 to form the semiconductor module 100a. Memory devices 125 of the memory module 100a may be disposed and/or formed perpendicular to a surface (e.g., one side surface) of the logic device 110. The memory module 120 includes a plurality of memory devices 125, and generally includes eight (8) memory devices 125, but may contain any other suitable number of memory devices 125, and thus is not limited thereto. Although FIG. 1A illustrates that the memory devices 125 are formed on external surface of module substrates 130, this is simply an example, and the memory devices 125 may be disposed and/or formed on other surfaces of the module substrates 130.

The memory devices 125 may be formed and/or disposed on a first surface of the module substrates 130, or may be formed and/or disposed on both a first and a second surface (e.g., side surfaces of the module substrate 130). Among the memory devices 125, a memory control chip may be included. Alternatively, the memory devices 125 themselves may include a memory controller module.

The module substrates 130 may electrically connect the logic device 110 to the memory modules 120, i.e., the memory devices 125. The module substrates 130 are formed of a nonconductor, and may include a conductive interconnection. In the present general inventive concept, the module substrates 130 may be formed of a rigid or flexible material. The detailed description thereof will be provided with reference to cross-sectional views.

Supporters 140 may be formed and/or disposed on at least one surface of module substrate 130 (e.g., supporters 140 may be disposed on a side surface of the module substrate 130). The supporters 140 may be formed on a first surface and a second surface (e.g., both side surfaces) of the module substrates 130, or the module substrates 130 may be formed on a first surface and a second surface (e.g., both side surfaces) of the supporters 140. In this case, the module substrates 130 and the supporters 140 may be formed independently from each other. The supporters 140 may be in physical contact with a main circuit board or module socket to be fixed. Alternatively, the supporters 140 may be in physical contact with or spaced from the logic device 110.

The supporters 140 may support the module substrate 130 such that the module substrate 130 can be continuously perpendicular to at least one surface of the logic device 110. For example, the supporters 140 may be partially or wholly bonded to the module substrate 130. Alternatively, the module substrate 130 may be supported by the supporters 140 to be partially or wholly hung. The detailed descriptions of the supporters 140 will be provided below.

A heat transfer device 160 such as a heat sink may be mounted on the logic device 110. Although the heat transfer device 160 may dissipate heat of the logic device 110, in exemplary embodiments, a cooling fan (e.g., cooling fan 170 of FIG. 1B) may be mounted on the heat transfer device 160. As illustrated in FIG. 1B, the memory modules 120 may be formed and/or disposed in two directions and spaced from at least two surfaces of the logic device 110 or the heat transfer device 160. The memory modules 120 may be formed or disposed on at least one surface of the logic device 110 or heat transfer device 160 so that the flow of air for cooling at least the logic device 110 may at least pass between the surfaces of the memory modules 120 and the logic device 110 or the heat transfer device 160. Although FIG. 1B illustrates the cooling fan 170 disposed on the heat transfer device 160 may dissipate heat from the semiconductor module 100b by either transferring air to the plurality of surfaces of the heat transfer device 160 or pulling hot air from the plurality of surfaces of the heat transfer device 160, the heat transfer device 160 may be used without the cooling fan 170 as illustrated in FIG. 1A to dissipate heat from the semiconductor module 100a. The detailed descriptions of the heat transfer device 160 will be provided below.

Referring to FIG. 1B, a semiconductor module 100b according to the inventive concept includes a plurality of memory modules 120, with each formed and/or disposed opposite a different surface of the logic device 110. Also, the memory devices 125 may be formed and/or disposed on two surfaces of the module substrates 130. As illustrated in FIG. 1B, the logic device 110 has a rectangular shape, and the memory modules 120 may be formed, disposed, and/or space opposite each of the four surfaces of the rectangular shape of the logic device 110. Also, the memory modules 120 may include memory devices 125 formed on both surfaces of the module substrate 130. In addition, the module substrates 130 may be formed in a multilayer structure. The detailed description thereof will be provided below, and example embodiments according to the present general inventive concept will be further specified with reference to the accompanying drawings.

A cooling fan 170 may be mounted on the heat transfer device 160. Since the memory modules 120 may be each formed, disposed, and/or spaced opposite a surface of the logic device 110 and the heat transfer device 160, the flow of air for cooling may be restricted. The example embodiment describes that mounting the cooling fan 170 on the heat transfer device 160 may increase the cooling efficiency.

Generally, a logic device and a memory device may be formed and/or disposed on different places in an electronic system including a personal computer. That is, a main circuit board of the electronic system may include a plurality of slots capable of communicatively coupling memory devices. Performance of the electronic system may be improved by reducing a communication path between the logic device and the memory device. Current and future semiconductor devices operate in units of picoseconds (i.e., smaller than nanoseconds). Decreasing the length of a transfer path of each electronic signal may stably and speedily improve the operation of the electronic system. However, since the transfer path functions as a resistor in the electronic system, it is not easy to shorten the path. That is, in order to normally operate the electronic devices and electronic system without malfunction, mutual impedance between the connected electronic devices typically should be matched. Any changes in length of each transfer path may correspondingly impact the electronic devices attached thereto, and should be taken into account and overcome by the design technique. Presently, specifications with respect to shrinking the length of the transfer path are not available, and thus this poses an obstacle to the resolution of the impedance-matching. More specifically, when the transfer path is arbitrarily shortened in length, a semiconductor device, a semiconductor module, a semiconductor circuit board, etc. may be adversely affected, as the impedance of the transfer paths and the connected devices may not be matched. The present general inventive concept addresses this, as detailed below.

In various example embodiments, the logic device may be formed, disposed, and/or spaced from the memory devices at a predetermined distance, such that the logic device and the memory devices are adjacent to one another. That is, since the logic device and the memory device are formed, disposed, and/or spaced adjacent from one another (i.e., close to each other), data transmission/reception speed is greatly increased. In addition, when random access memories (RAM), having rapid speed among memories, are adapted, they may be used as a cache memory of the logic device. Although they need not necessarily be used as the cache memory, since the signal processing speed of the logic device is greatly increased, the performance of the electronic system is improved.

The logic device and the memory device may be formed and/or disposed on the module substrate to be electrically connected to each other. The logic device 110, illustrated, for example, in FIGS. 1A and 1B, may be a central processing unit (CPU). This is to facilitate the spirit of the inventive concept to be easily understood, but is not limited hereto. That is, the description of arrangements provided herein may be applied to various logic devices including a microprocessor, a graphic processor, etc. Also, the present general inventive concept may be applied to a dual processor or multi-processor, multi-logic chip, or multi-graphic chip arrangement. However, the drawings and descriptions herein relate to a single logic device for clarity.

Figure 2:
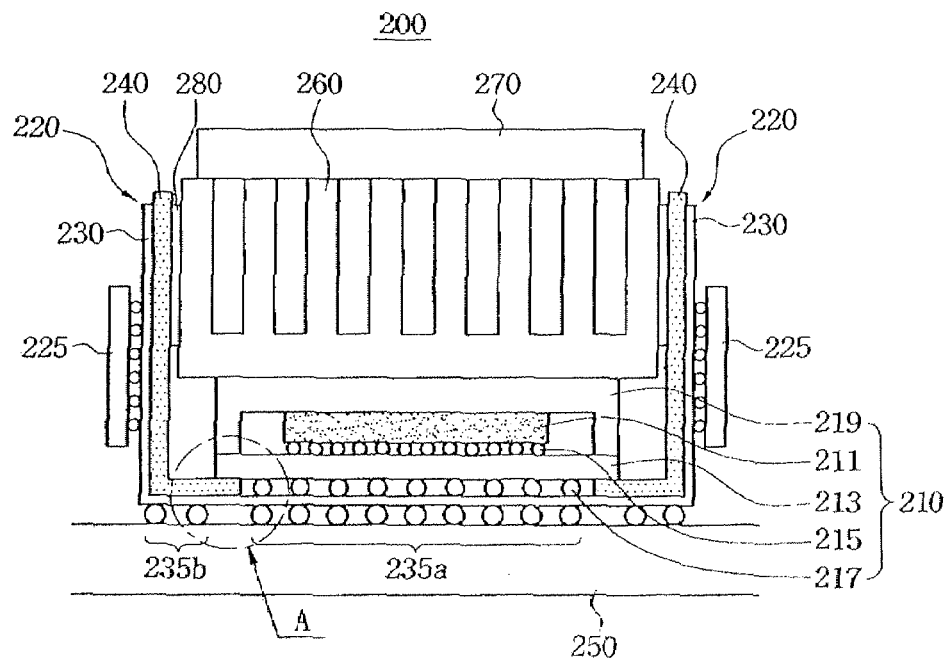
FIG. 2 is a cross-sectional view illustrating the semiconductor module according to exemplary embodiments of the present general inventive concept.

FIG. 2 is a cross-sectional view of a semiconductor module 200 according to example embodiments of the present general inventive concept. Referring to FIG. 2, the semiconductor module 200 includes a logic device 210 formed and/or disposed on a three-dimensional module substrate 230 and memory devices 225. The memory devices 225 in the example embodiments of the present general inventive concept may be similar to memory module 220. The memory module 220 may include the module substrate 230 on which a plurality of memory devices 225 are integrated and/or disposed.

The memory modules 220 may be electrically connected to a main circuit board 250 or a module socket 250 through connection units 235a.

As described above, the module substrate 230 may be formed of a rigid or flexible material. Both cases have advantages and disadvantages. For example, when the module substrate 230 is formed of a rigid material, it may facilitate in providing shape, reducing cost, and minimizing the shape or function of a supporter. When the module substrate 230 is formed of a flexible material, it may be formed in various structures. Also, it may be less vulnerable to damages, and may have other functional features. The referential description thereof will be provided below.

The module substrate 230 illustrated, for example, in FIG. 2, may be formed of a plurality of separated or assembled unit module substrates. The module substrate may form a predetermined angle with the logic device 210, and may be an integral-type substrate that curves to form a right angle with the logic device 210. The module substrate 230 may be formed of a nonconductor. The module substrate 230 may be formed of plastic, ceramic, glass or other insulating inorganic materials, or any other suitable material. Also, the module substrate 230 may be a printed circuit board (PCB) or a flexible printed circuit board (FPC). When the module substrate 230 is formed of a rigid material, a plurality of rigid module substrates 230 may be assembled by being combined with each other, or may be assembled using other suitable methods. Alternatively, when the module substrate 230 is formed of a flexible material, both the logic device 210 and the memory devices 225 may be formed on the single module substrate 230.

The logic device 210 may be mounted on a part of the module substrate 230. The logic device 210 may include a logic chip 211 in a wafer state that is mounted on a logic package substrate 213, and logic package connection units 217. The logic device 210 may be electrically connected to logic package connection units 217 through logic chip connection units 215. The logic package connection units 217 may be formed and/or disposed on the module substrate 230 to be electrically connected to the main circuit board 250 through the module connection units 230*a*. When a bare chip package technique is applied, the logic chip 211 in a wafer state may be directly mounted on the module substrate 230.

Although the logic device 210 may be mounted on any part of the module substrate 230, it is illustrated and described that the logic device 210 is mounted on the center portion of the module substrate 230 for clarity. That is, the logic device 210 may be symmetrically formed on the module substrate 230. However, the logic device 210 may be mounted on an edge portion of the module substrate 230.

The logic device 210 may include the logic chip 211 mounted on the package substrate 213, and a package lid 219 covering the logic chip 211. The package lid 219 may include a metal in order to improve a heat transfer rate. That is, the package lid 219 may be formed of a metal or may be formed of a material containing a metal (a metal compound, a metal alloy or an inorganic material partially containing a metal). Alternatively, the package lid 219 may have a multilayer structure. That is, a first surface (e.g. an inner surface) of the package lid may have insulating properties and may be formed of a nonconductor including ceramic, and a second surface (e.g., an external part) may be formed of a metal. In other words, the package lid 219 may include an insulating layer (e.g., lower portion) and a metallic layer (e.g. upper portion). When an inner part of the package lid 219 is filled with an insulating filler, such as an epoxy resin, the package lid 219 may be formed of a single-layer metal plate.

In order to enhance the dissipation of heat from the logic device 210, the logic chip 211 may be in contact with the package lid 219 through a material having increased heat transfer ability to transfer the heat generated by the logic device 210 to another surface or area. The material having increased heat transfer ability may be a metal. In this case, an upper surface of the logic chip 211 may be protected by an insulating material. The material having increased heat transfer ability may be an insulating material. The insulating material may have a decreased heat transfer ability compared to the metal. The insulating material may be formed of a polymer, in order to form it into various shapes using a thermoforming method. One insulating material having increased thermal conductivity has been developed and sold by Cool Polymers Inc., in the U.S., but the insulating material is not limited thereto.

The logic device 210 may generally have an increased number of input/output units than the memory device 225, and may utilize an increased amount of electrical power. As such, the logic device 210 may generate heat. Therefore, the logic device 210 such as CPU may include a heat transfer device 260 and cooling fans 270 for cooling. FIG. 2 illustrates that the heat transfer device 260 and the cooling fans 270 are mounted on the package lid 219 of the logic device 210.

The heat transfer device 260 may absorb and dissipate heat generated from the logic device 210. A thermo-electric cooler (TEC) module using the Peltier Effect, and a heat pipe using phase change cooling technology, or any other suitable device may be adapted as the heat transfer device 260. FIG. 2 illustrates that the heat transfer device 260 is formed in a concavo-convex shape that includes a plurality of cooling fins. The heat transfer device 260 and/or the cooling fins may be formed of a metal such as stainless steel, aluminum, or any other suitable metal in order to increase the heat transfer ability.

The cooling fans 270 may be disposed so as to blow air toward or from the heat transfer device 260 when the cooling fan 270 is operated. Since the cooling fans 270 are well-known, the detailed description thereof will be omitted.

The memory devices 225 may be mounted on a part of the module substrate 230. Although FIG. 2 illustrates that the memory devices 225 are packaged in a flip-chip form, they are not limited thereto. The memory devices 225 may be resistive random access memory (RRAM) including dynamic random access memory (DRAM), static random access memory (SRAM), non-volatile memory (NVM), FLASH, and/or magnetoresistive random access memory (MRAM), or phase-change random access memory (PRAM). For clarity and simplicity, the memory device 225 is described below as DRAM.

In the module substrate 230, a part on which the logic device 210 is mounted may be parallel to the main circuit board 250, and another part on which the memory device 225 is mounted may be adjacent to the heat transfer device 260 of the logic device 210. For example, as illustrated in FIG. 2, when the main circuit board 250 is placed in a first direction (e.g., a horizontal direction), the part of the module substrate 230 on which the logic device 210 is mounted may be disposed in the first direction (e.g., the horizontal direction), and the part of the module substrate on which the memory device 225 is mounted may be formed in a second direction (e.g. vertical direction).

A surface of the module substrate 230 on which the memory device 225 is mounted is opposite to a surface on which the logic device 210 is mounted. However, the directions are not necessarily opposite to each other, and the description thereof will be provided below. Supporters 240 may be formed on the surface of the module substrate 230 facing the logic device 210 or the heat transfer device 260.

FIG. 2 illustrates that the height of the module substrate 230 on which the memory devices 225 are formed is lower than an upper end portion of the heat transfer device 260. Alternatively, the module substrate 230 may be formed higher than the upper end portion of the heat transfer device 260, and it may be formed higher than an upper end portion of the cooling fan 270.

The module substrate 230 may be electrically connected to the main circuit board 250 through module connection units 235*a*. The module connection units 235*a* may function the same as a bump (e.g., supporting bumps 235*b*, as described below), and may be formed in various shapes including a mesa, a pin, etc. For clarity, the module connection units 235*a* are described throughout as being formed in the shape of a ball.

The supporters 240 may be formed on either the whole surface or a part of the surface of the module substrate 230. The supporters 240 may be formed of a metal plate, a metal frame or a metal wire. In the below description, supporters 240 are described as a metal plate for illustrative purposes and for clarity. The metal plate of supporters 240 may be in physical contact with the module substrate to physically support the module substrate. In particular, when the module substrate 230 is formed of a flexible material, the metal plate provides structural support and to the module substrate 230. The metal plate may absorb heat generated from the memory devices 225 to transfer the heat to the main circuit board 250 or to the heat transfer device 260, or it may directly dissipate the heat. The module substrate 230 may be in contact with the supporters 240 as a part or as a whole. Alternatively, the module substrate 230 may be formed and/or disposed to be coupled to the supporters 240.

The supporters 240 may include electrical interconnections transmitting a specific electrical signal on the module substrate 230. In this case, the supporters 240 may transfer a supply voltage or ground voltage facilitating the establishment of impedance of an electrical interconnection.

The supporters 240 may be formed in the shape of a flat panel, a net, a plurality of pillars arranged in a vertical or horizontal direction, or in any other suitable shape. The supporters 240 may be directly bonded to the module substrate 230 using a medium such as an adhesive, and the supporters 240 may be combined with each other using various fasteners. The shapes of the supporters 240 illustrated in FIG. 2 are to facilitate the spirit of the present general inventive concept to be easily understood, and do not serve as a limitation thereof. Therefore, it should be understood that the supporters 240 may comprise different shapes than those illustrated in FIG. 2.

Ends of the supporters 240 adjacent to the main circuit board 250 may be formed parallel to the main circuit board 250. That is, lower end portions of the supporters 240 may be formed in a bent shape. As illustrated in FIG. 2, as the module substrate 230 is formed and/or disposed on external surfaces of the supporters 240, supporting bumps 235b may be formed and/or disposed between the bent portions of the supporters 240 and the main circuit board 250. The supporting bumps 235b may or may not electrically connect the module substrate 230 to the main circuit board 250. That is, the supporting bumps 235b may be one of the module connection units 235a or dummies (i.e., the supporting bumps 235b do not electrically connect the module substrate 230 to the main circuit board 250). The supporting bumps 235b and the module connection units 235a may be simultaneously formed. Furthermore, upper end portions of the supporters 240 may be formed in a bent shape. The descriptions thereof will be provided below.

The supporters 240 may be in physical contact with the heat transfer device 260 formed on the logic device 210. A part of the supporters 240 may be bonded or coupled to the heat transfer device 260. Moreover, the part of the supporters 240 may be in contact with the heat transfer device 260 or may be spaced apart from the heat transfer device 260 by a distance. As illustrated in FIG. 2, the supporters 240 are bonded to the heat transfer device 260 through a medium 280 such as an adhesive. Alternatively, the supporters 240 and the heat transfer device 260 may be formed as an integral unit. When the medium 280 is omitted as in some of the drawings (e.g., FIGS. 4-10), the supporters 240 may be formed and/or disposed to be spaced apart from the heat transfer device 260 by a distance. In the example embodiments discussed below, the medium 280 is no longer illustrated in the drawings (e.g., FIGS. 4-13) for simplicity. However, the medium 280 may be applied in one or more of the example embodiments.

The surfaces of the supporters 240 may be formed in a concavo-convex shape, or any other suitable shape. The detailed description thereof will be provided below.

As illustrated in Part A of FIG. 2, that the lower end portions of the supporters 240 may be bonded to, fixed to, or combined with the logic device 210. More specifically, the package substrate 213 of the logic device 210 may be mounted on the lower end portions of the supporters 240, and they may be fixed together. In example embodiments, the supporters 240 and the package substrate 213 of the logic device 210 may be formed of a rigid material. When the supporters 240 and the package substrate 213 of the logic device 210 are fixed, they may maintain the same shape as a whole, and that a completed product may be manufactured. Although FIG. 2 illustrates that the supporters 240 are in contact with the package substrate 213 of the logic device 210, it should be understood that the supporters 240 may be bonded to, fixed to, or combined with the package substrate 213 of the logic device 210. It should be understood that the supporters 240 may be compatible with the package substrate 213 of the logic device 210 regardless of contact in the example embodiments described throughout.

Figure 3:
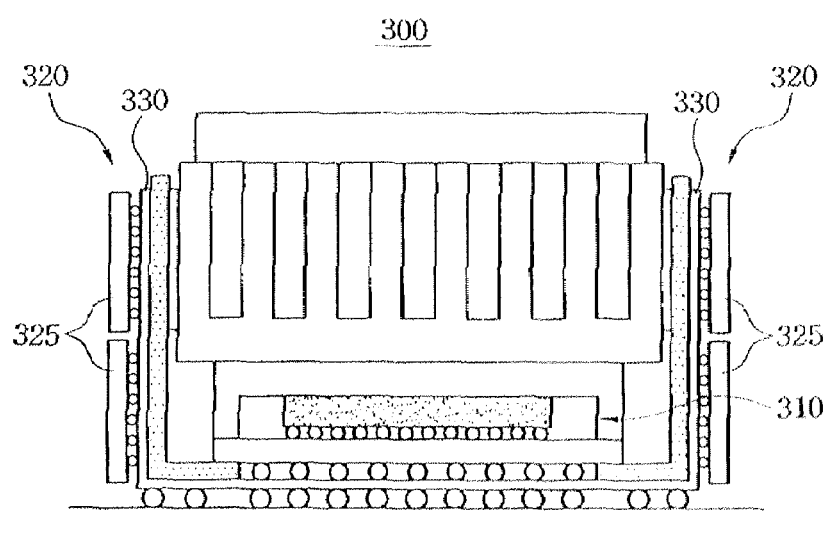
FIGS. 3, 4, 5A, 5B, 6A, 6B, 7A, 7B, 8A, 8B, 9A, 9B, 10 are cross-sectional views illustrating semiconductor modules according to exemplary embodiments of the present general inventive concept.

FIG. 3 is a cross-sectional view illustrating a semiconductor module 300 according example embodiments of the present general inventive concept. Referring to FIG. 3, a memory module 320 includes memory devices 325 disposed and arranged on a module substrate 330 in two or more rows is illustrated. That is, the memory devices 325 may be arranged on the module substrate 330 in two or more rows. This characteristic may be advantageously applied when the length or width of a logic device 310 is insufficient to arrange the memory devices 325 or integrate more memory devices 325. For example, assuming that there are eight (8) memory devices 325 included in the single memory module 320, the eight (8) memory devices 325 may be formed and/or disposed in two or more rows or sixteen (16) memory devices 325 may be formed and/or disposed in two or more rows. Referring to FIG. 3, in the memory module 320, the memory devices 325 may be arranged in various forms or in the same repeated form. That is, the memory devices 325 may be arranged so as to maximize the number of the memory devices 325 included in the memory module 320. For example, the memory device 325 illustrated in FIG. 3 may represent a single memory module 320 including a plurality of memory devices arranged in a horizontal direction. Therefore, it may be understood that two memory modules may be disposed in the same direction as illustrated by the memory module 320 in FIG. 3. The descriptions of the other elements illustrated in FIG. 3 are provided with reference to FIG. 2 and descriptions thereof. Since the memory controller may be formed on the module substrate in various example embodiments, the location and number of memory devices is not limited.

Figure 4:
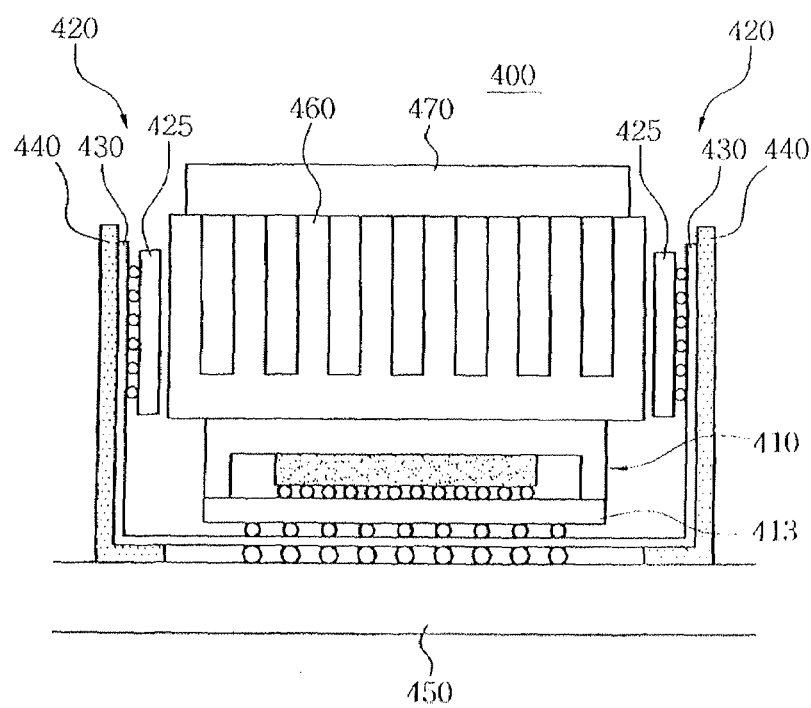

FIG. 4 is a cross-sectional view illustrating a semiconductor module 400 according to example embodiments of the present general inventive concept. Referring to FIG. 4, the semiconductor module 400 includes a logic device 410 formed on a surface of a module substrate 430, and memory devices 425 included in memory modules 420 are formed on the same surface as the logic device 410. In other words, the module substrate 430 is formed on surfaces of supporters 440 facing the logic device 410. As illustrated in FIG. 4, since the logic device 410 and the memory devices 425 of the memory modules 420 are formed on the same surface of the module substrate 430, an assembly process may be easily performed. In addition, as illustrated, since the module substrate 430 may not penetrate between the supporters 440 and the main circuit board 450, the supporters 440 may be fixed onto or be disposed in contact with the main circuit board 450. When the supporters 440 are fixed onto the main circuit board 450, circuit integration density of the main circuit board 450 can be improved, and characteristics of an electronic circuit can be systematically improved.

In the semiconductor module 400 illustrated in FIG. 4, lower end portions of the supporters 440 may not be in contact with the package substrate 413 of the logic device 410.

In the semiconductor module 400, the memory devices 425 are spaced from (e.g., positioned in the vicinity of) a heat transfer device 460, cooling efficiency is further improved. Generally, the heat transfer device 460 has a lower temperature than the other elements of the semiconductor module 400 adjacent to the heat transfer device 460. Also, the heat transfer device 460 may be directly exposed to air blown from a cooling fan 470, and thus cooling efficiency can be further enhanced.

In addition, the module substrate 430 and the memory devices 425 may be protected from physical impact by the rigid supporters 440.

Figure 5A:
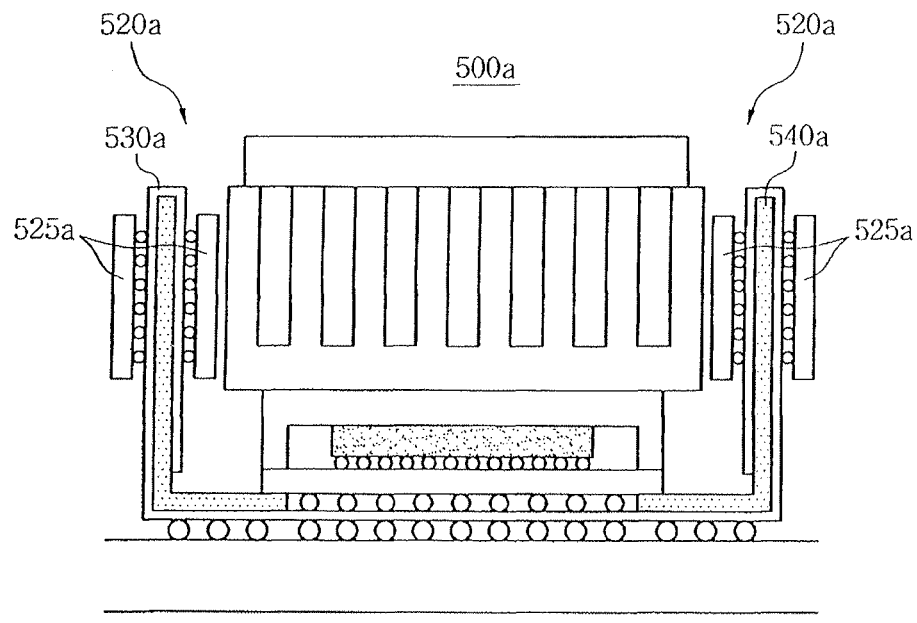
Figure 5B:
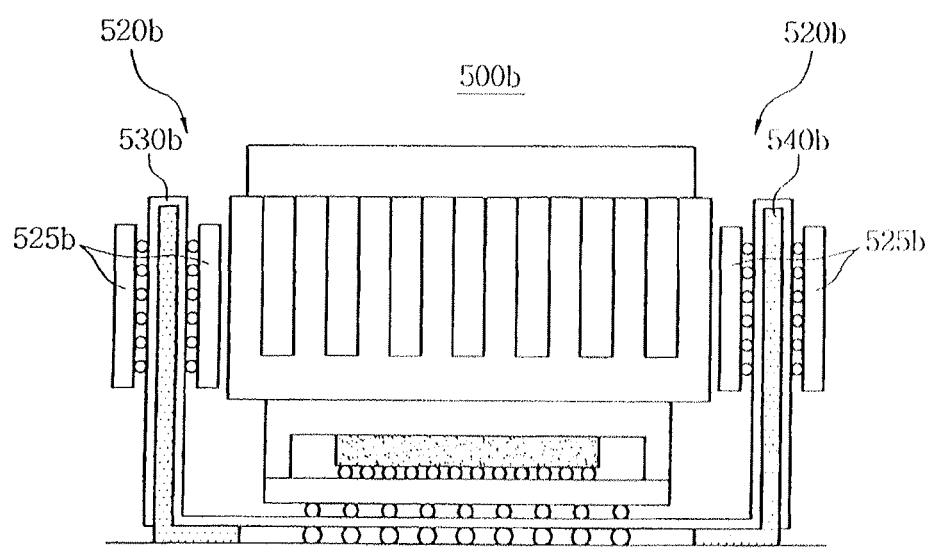

FIGS. 5A and 5B are cross-sectional views illustrating semiconductor modules 500a and 500b according to example embodiments of the present general inventive concept. Referring to FIG. 5A, the semiconductor module 500a includes memory modules 520 a including a module substrate 530a extending from external surfaces of supporters 540a to inner surfaces thereof, and memory devices 525 formed on the module substrate 530a on both surfaces of the supporters 540a. The module substrate 530a may surround upper end portions of the supporters 540a from the external surfaces to extend toward the inner surfaces of the supporters. When it is difficult to form all of the memory devices 525a on the surfaces of the supporters 525a in other example embodiments, the memory devices may be formed on both surfaces of the supporters 540a by extending the module substrate 530a across both surfaces of the supporters 540a as illustrated in FIG. 5a. That is, integration density of the components included in semiconductor module 500a can be improved.

Referring to FIG. 5B, a semiconductor module 500b according to the fifth example embodiment includes memory modules 520b including a module substrate 530b extending from inner surfaces of supporters 540b to external surfaces thereof, memory devices 525b formed on the module substrates 530b on inner side surfaces of the supporters 540b, and memory devices 525b formed on the module substrate 530b on external side surfaces of the supporters 540b. The semiconductor modules 500a and 500b according to example embodiments of the present general inventive concept may have the advantages of the semiconductor modules 300 and 400 illustrated in FIGS. 3 and 4, respectively.

Figure 6A:
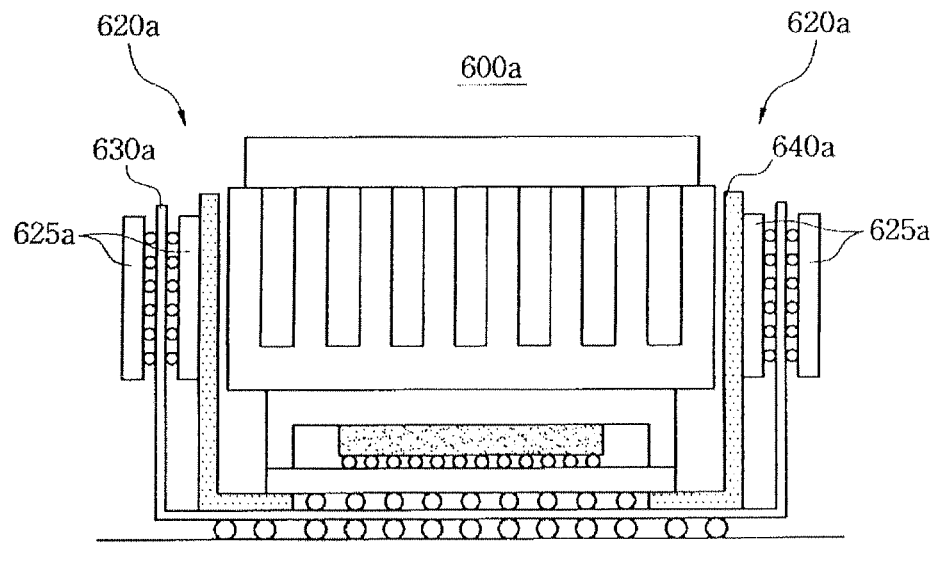
Figure 6B:
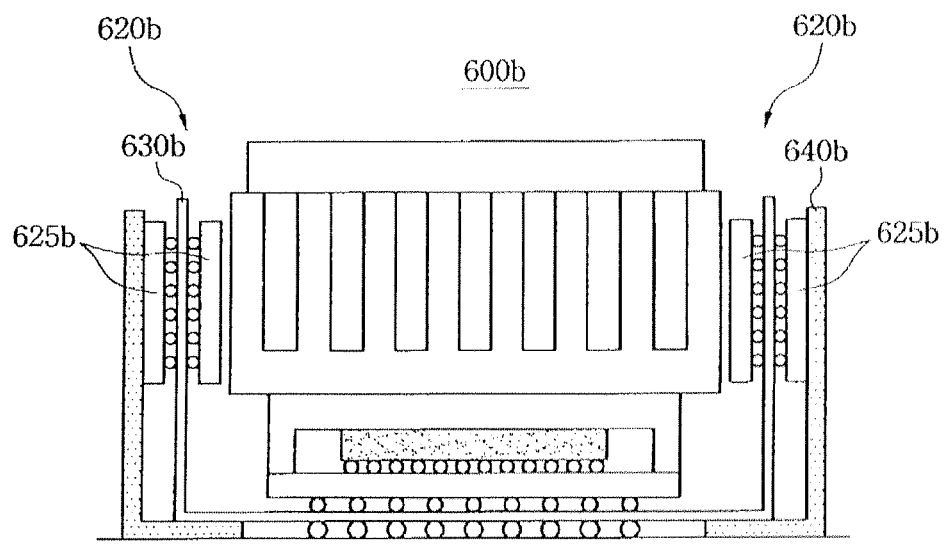

FIGS. 6A and 6B are cross-sectional views illustrating semiconductor modules 600a and 600b according to example embodiments of the present general inventive concept. Referring to FIGS. 6A and 6B, the semiconductor modules 600a and 600b include memory modules 620a and 620b that respectively include memory devices 625a and 625b formed on both surfaces of module substrates 630a and 630b. The memory devices 625a and 625b may be formed on both surfaces of the module substrates 630a and 630b disposed on surfaces of supporters 640a and 640b, and the module substrates 630a and 630b may be formed on surfaces of the supporters 640a and 640b. In the example embodiment, the module substrates 630a and 630b may be at least partially bonded to the supporters 640a and 640b rather than as a whole or may be fixed to or disposed on the supporters 640a and 640b. In the semiconductor module 600a illustrated in FIG. 6A, the memory devices 625a may be formed on both surfaces of the module substrate 630a formed on external surfaces of the supporters 640a. Further, in the semiconductor module 600b illustrated in FIG. 6B, the memory devices 625b may be formed on both surfaces of the module substrate 630b formed on inner surfaces of the supporters 640b.

Figure 7A:
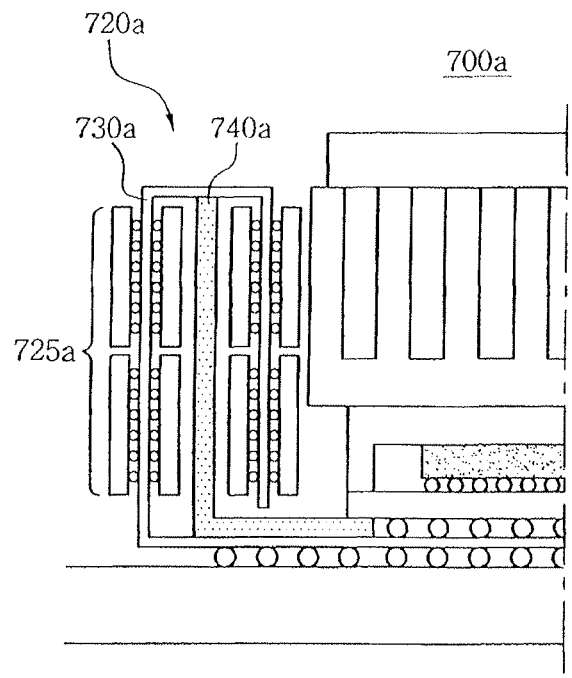
Figure 7B:
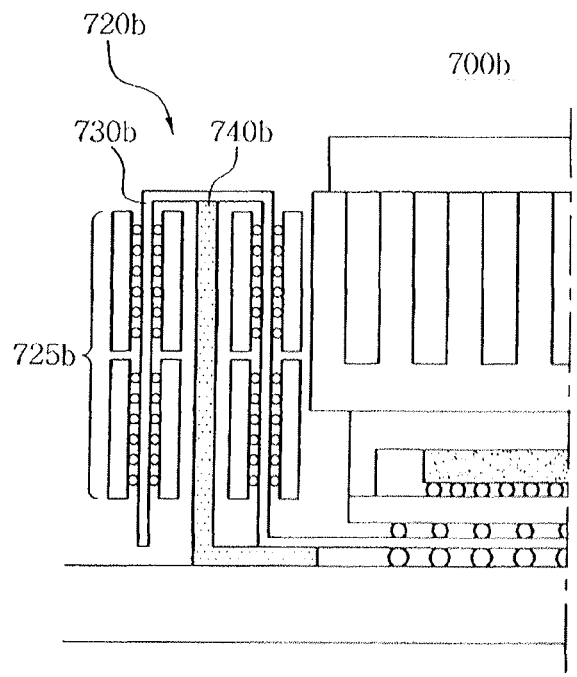

FIGS. 7A and 7B are cross-sectional views illustrating semiconductor modules 700a and 700b according to example embodiments of the present general inventive concept. Referring to FIGS. 7A and 7B, in the semiconductor modules 700a and 700b memory modules 720a and 720b include module substrates 730a and 730b are disposed on both surfaces of supporters 740a and 740b, and memory devices 725a and 725b are disposed on both surfaces of the module substrates 730a and 730b. Also, the memory devices 725a and 725b may be formed and/or disposed in two or more rows. It may be understood that the example embodiments may include at least some of features described throughout in connection with other example embodiments.

In the semiconductor module 700a illustrated in FIG. 7a, the module substrate 730a extends from a first surface (e.g., an external surface) of a supporter (e.g., 740a) to a second surface (e.g., an inner surface). In the semiconductor module 700b illustrated in FIG. 7B, the module substrate 730b extends from a first surface (e.g., an inner surface) of the supporter 740b to a second surface (e.g., an external surface).

Figure 8A:
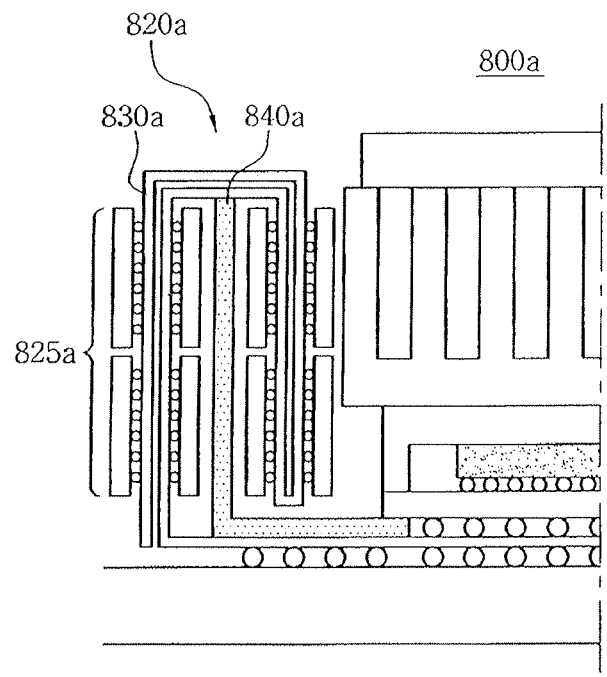
Figure 8B:
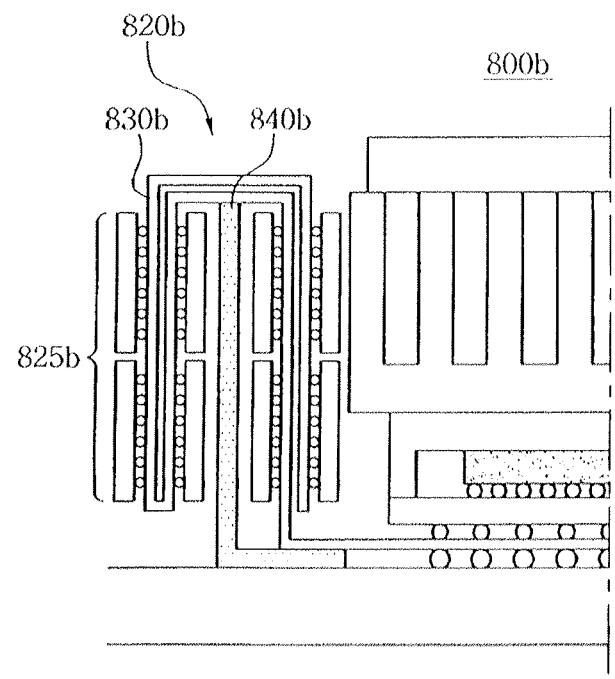

FIGS. 8A and 8B are cross-sectional views illustrating semiconductor modules 800a and 800b according to example embodiments of the present general inventive concept. Referring to FIGS. 8A and 8B, the semiconductor modules 800a and 800b include memory modules 820a and 820b that respectively include module substrates 830a and 830b are respectively formed in double-layer structure on both surfaces of supporters 840a and 840b, and memory devices 825a and 825b are formed on surfaces of the module substrates 830a and 830b. The module substrates 830a and 830b may be formed of a flexible material, or any other suitable material. The memory devices 825a and 825b may be respectively formed on the same surface of each of the module substrates 830a and 830b. The module substrates 830a and 830b may be formed in a bent shape.

Figure 9A:
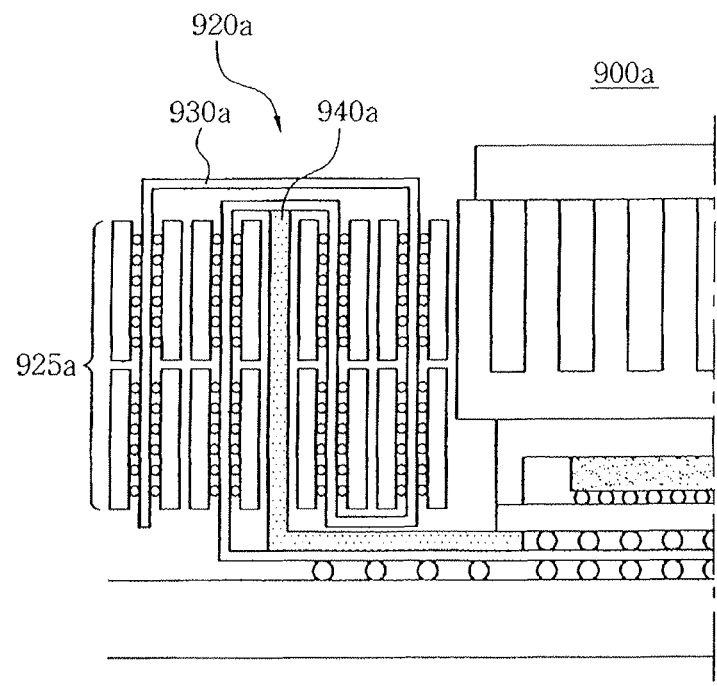
Figure 9B:
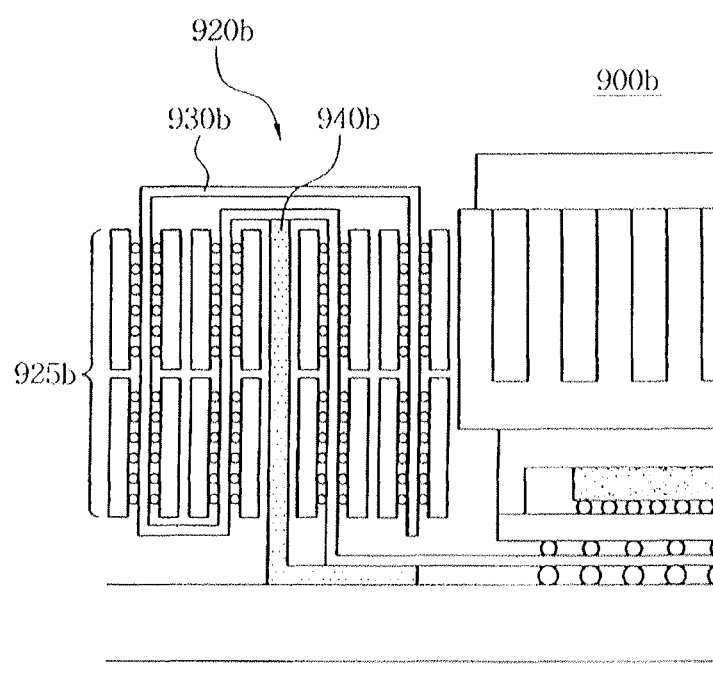

FIGS. 9A and 9B are cross-sectional views illustrating semiconductor modules 900a and 900b according to example embodiments of the present general inventive concept. Referring to FIGS. 9A and 9B, the semiconductor modules 900a and 900b include memory modules 920a and 920b that respectively include double-layered module substrates 930a and 930b formed on both surfaces of supporters 940a and 940b, and memory devices 925a and 925b formed on both surfaces of each of the module substrates 930a and 930b. The module substrates 930a and 930b may be formed as an integral unit or formed in a bent shape.

Figure 10:
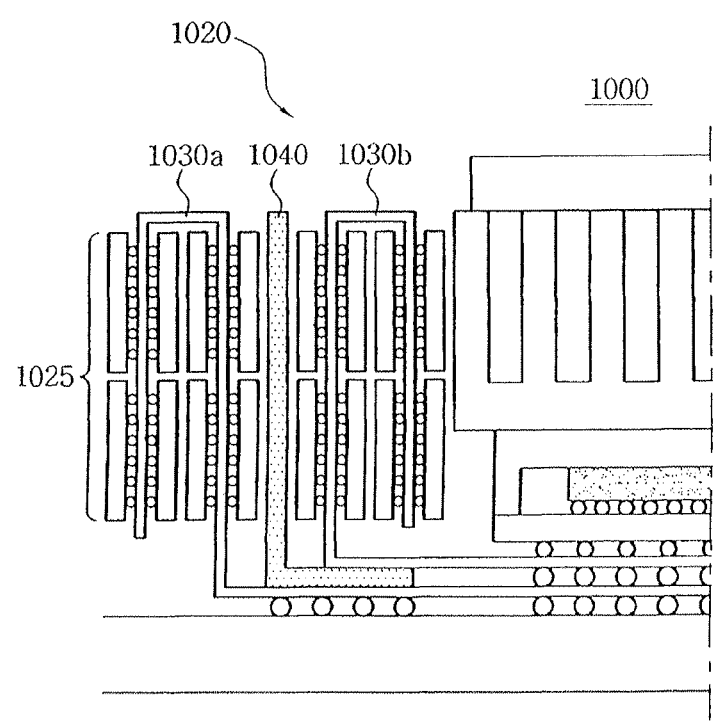

FIG. 10 is a cross-sectional view illustrating a semiconductor module 1000 according to example embodiments of the present general inventive concept. Referring to FIG. 10, the semiconductor module 1000 includes memory modules 1020 that include memory devices 1025 formed and/or disposed on two module substrates 1030a and 1030b. More specifically, the module substrates 1030a and 1030b formed and/or disposed on a first surface (e.g. external surface) and a second surface (e.g., inner surface) of a supporter 1040 may overlap in two layers on a place where the module substrates 1030a and 1030b are in contact with a logic device 1010 or a main circuit board 1050 to be connected to each other. The memory devices 1025 may be formed on both surfaces of each of the module substrates 1030a and 1030b. Each of the module substrates 1030a and 1030b may be formed in a bent shape.

Although the semiconductor module 1000 exhibits the spirit of the present general inventive concept, it may exhibit a combination of two or more example embodiments. That is, it may be understood that two or more of the example embodiments may be selected and combined.

FIGS. 11A to 11D, 12A to 12C, 13A to 13D illustrate shapes of supporters according to example embodiments of the present general inventive concept.

Figure 11A:
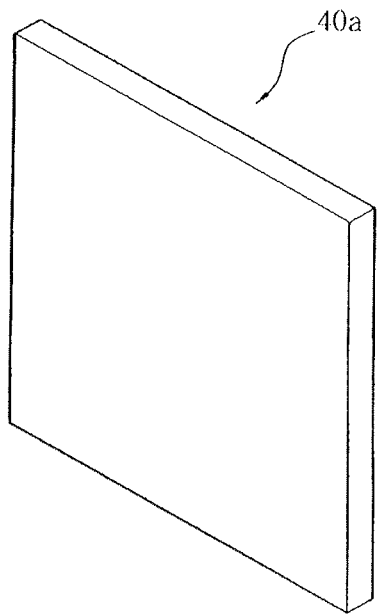
FIGS. 11A to 11D, 12A to 12C, 13A to 13D illustrate shapes of supporters according to exemplary embodiments of the present general inventive concept.

Referring to FIG. 11A, a supporter 40a may be formed in a flat plate-type shape. Supporter 40a may be in the shape of a rectangular flat plate.

Figure 11B:
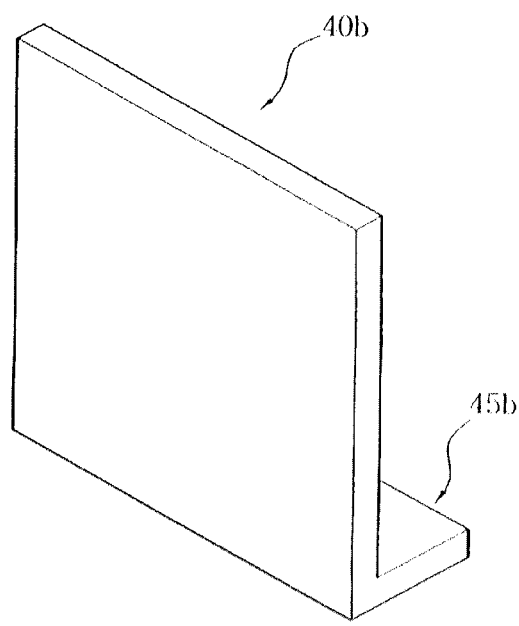

Referring to FIG. 11B, a supporter 40b according to the various example embodiments is formed in a flat plate shape, and may have a lower end portion 45b formed in a bent shape. The bent angle or length may be set in one or more suitable angles and may have different suitable lengths. The bent portion of the lower end portion 45b may be combined with a main circuit board (or a socket) or to be combined with a package substrate of the logic device. Alternatively, the bent portion of the lower end portion 45b may be combined with other elements or to increase balance and stability of the supporter 40b.

Figure 11C:
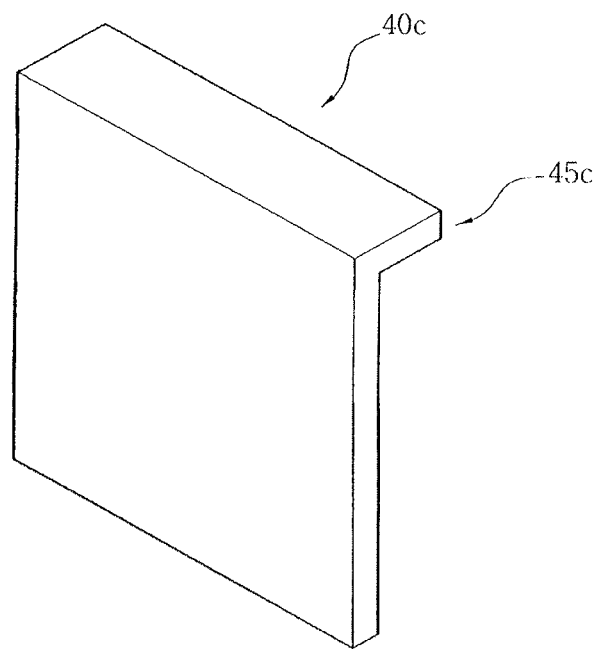

Referring to FIG. 11C, a supporter 40c according to the various example embodiments is formed in a flat plate shape, and may have an upper end portion 45c formed in a bent shape. Like the bent lower end portion 45b, the bent angle or length of the upper end portion 45c may be set in one or more suitable angles and may have different suitable lengths. The bent portion of the upper end portion 45c may be in contact with or combined with a heat transfer device. Alternatively, it may be used to fix a module substrate in a particular position.

Figure 11D:
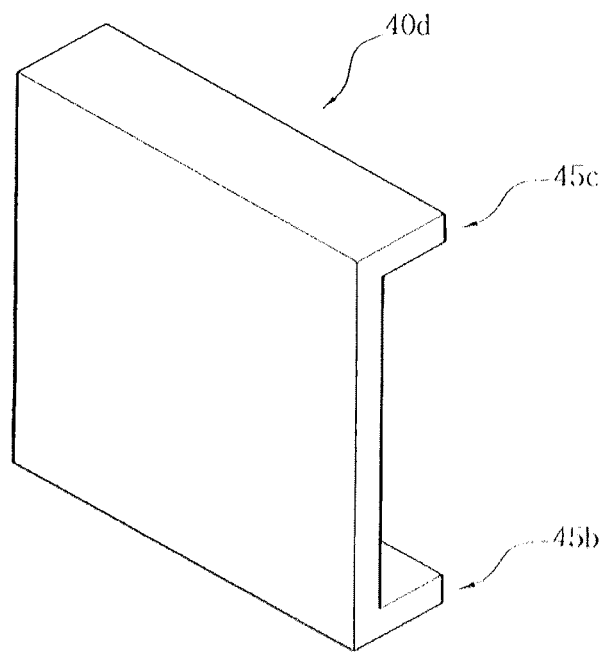

Referring to FIG. 11D, a supporter 40d according to the various example embodiments may be formed in a flat plate shape, and may have upper and lower end portions 45c and 45b, respectively, that are formed in a bent shape.

Figure 12A:
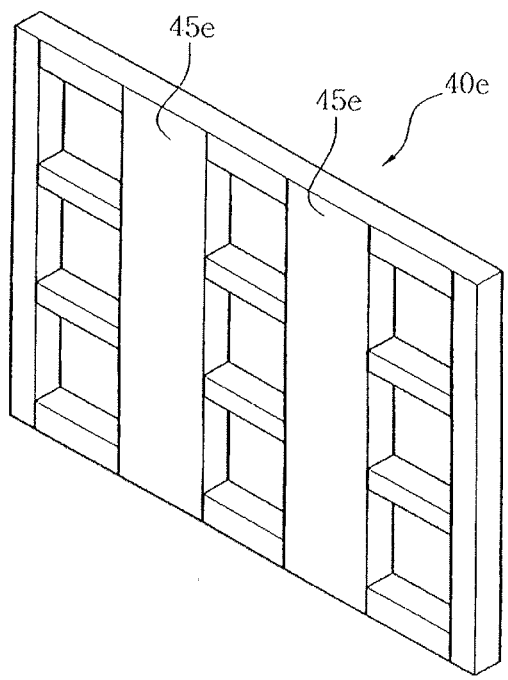

Referring to FIG. 12A, a supporter 40e according to the various example embodiments may be formed to be combined with a plurality of flat plates 45e lengthened in a longitudinal direction.

Figure 12B:
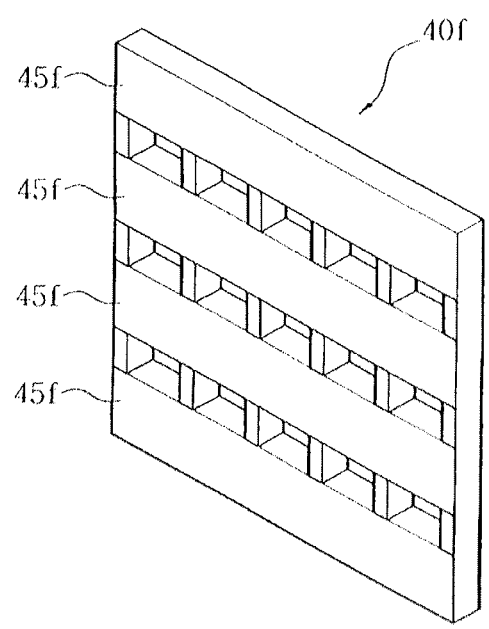

Referring to FIG. 12B, a supporter 40f according to the various example embodiments may be formed to be combined with a plurality of flat plates 45f lengthened in a horizontal direction.

Figure 12C:
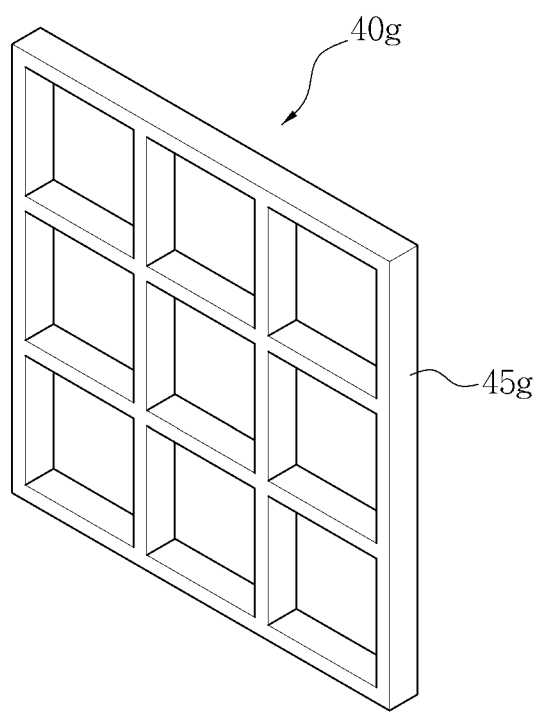

Referring to FIG. 12C, a supporter 40g according to the various example embodiments may be formed to cross a plurality of pillars 45g in vertical and horizontal directions. In other words, it may be formed in a net or grating shape.

Figure 13A:
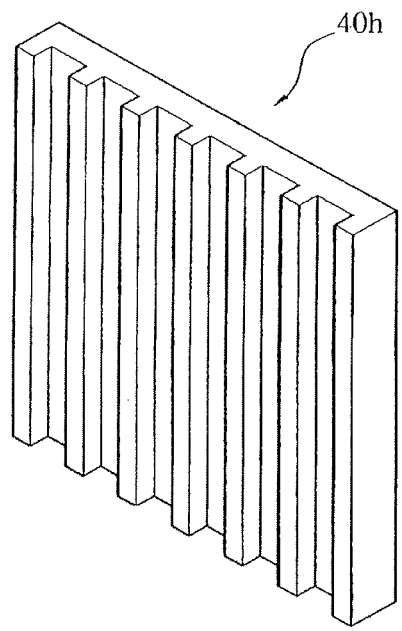

Referring to FIG. 13A, a supporter 40h according to the various example embodiments may have at least one surface formed in a concavo-convex shape. That is, it may be formed to have a fin shape. The concavo-convex shape may be construed as cooling fins. That is, the supporter 40h is formed in the shape of cooling fins, so that heat generated from a memory device and a module substrate, or any other suitable electronic component, may be effectively dissipated. That is, heat transfer and dissipation ability can be improved.

Figure 13B:
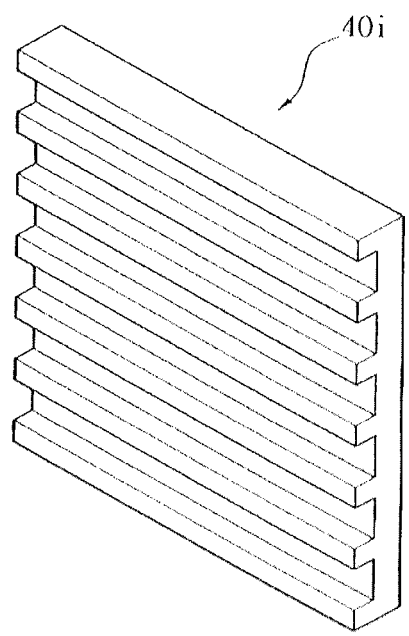

Referring to FIG. 13B, a supporter 40i according to the various example embodiments may have at least one surface formed in a concavo-convex shape in a first direction (e.g., horizontal direction).

Figure 13C:
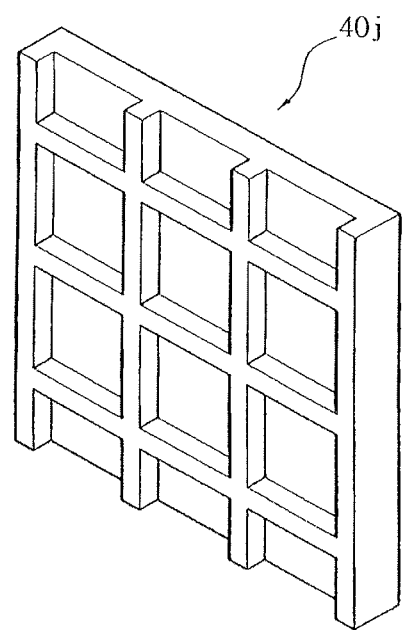

Referring to FIG. 13C, a supporter 40j according to the various example embodiments may have a concavo-convex grating shape.

Although the supporters 40h, 40i and 40j illustrated in FIGS. 13A to 13C have concavo-convex patterns formed on one surface, this is to facilitate the spirit of the present general inventive concept so as to be easily understood. Other surfaces of each of the supporters 40h, 40i and 40j may be formed in a concavo-convex shape as well, or any other suitable shape.

Figure 13D:
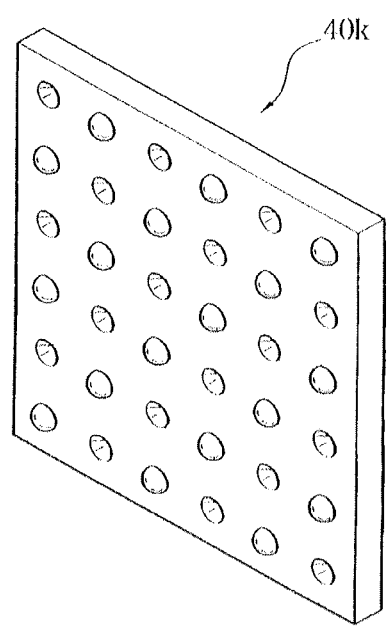

Referring to FIG. 13D, a supporter 40k according to the various example embodiments may have at least one surface formed in an embossed shape (e.g., a dimpled shape). The embossed shape may include protrusions or depressions. The surface area of the supporter 40k having the embossed surface is increased, and thus cooling efficiency, i.e., the heat dissipation and/or transfer ability is enhanced.

Figure 14:
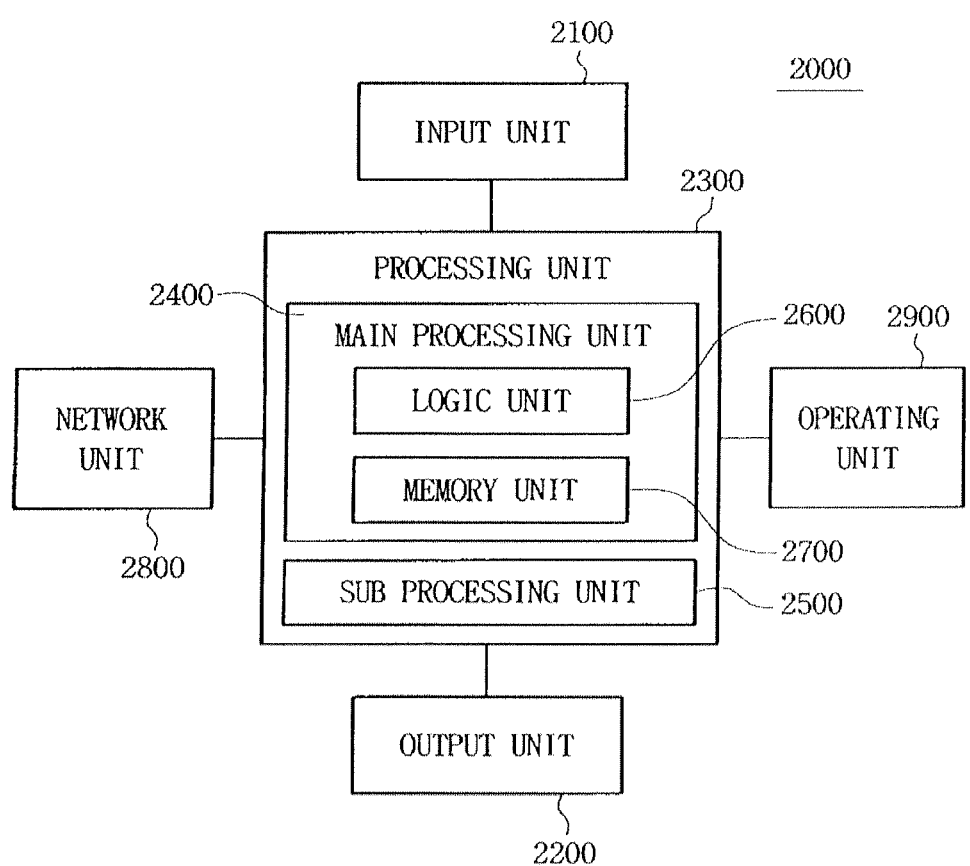
FIG. 14 is a block diagram illustrating an electronic system 2000 according to exemplary embodiments of the general inventive concept.

FIG. 14 is a block diagram illustrating an electronic system 2000 according to exemplary embodiments of the general inventive concept. Referring to FIG. 14, the electronic system 2000 may include an input unit 2100, an output unit 2200, and a processing unit 2300. The electronic system 2000 may be a personal computer, a mobile phone, a portable electronic system, a remote controller, a system controller, a part of an electronic working system, etc.

The input unit 2100 may be a keyboard, a mouse, a keypad, a touchpad, a sensor, RF receiver, etc. The output unit 220 may be a display, a printer, a light, RF transmitter, etc.

The processing unit 2300 may process signals transmitted from input unit 2100. The processing unit 2300 may include a main processing unit 2400 and a sub process unit 2500. The main processing unit 2400 and/or the sub processing unit 2500 may be or include one of the semiconductor modules according to exemplary embodiments of the general inventive concept.

The main processing unit 2300 may include a logic unit 2600 and a memory unit 2700. The logic unit 2600 may be a logic device according to an embodiment of the general inventive concept. The main processing unit 2400 may be a microprocessor or a memory controller. The memory unit 2700 may be one of the memory modules or memory devices according to an embodiment of the general inventive concept. Otherwise, the memory unit 2700 may be a storage unit such as a DRAM, SRAM, NVM, Flash RAM, another type of RAM, or hard disk drive (HDD). Otherwise, the logic unit 2600 and/or the memory unit 2700 may include one of the semiconductor modules according to exemplary embodiments of the present general inventive concept, respectively.

The electronic system 2000 may further include a network unit 2800 and an operation unit 2900. The network unit 2800 may be a wire/wireless network server or a wire/wireless network client. The operating unit 2900 may be operated by a command of the processing unit 2400.

Various applied example embodiments based on the present general inventive concept may attract remarkable attention as the next generation technique in the field of an electronic system, and may be regarded as the next generation standard.

As described above, in a semiconductor module and an electronic system according to the present general inventive concept, a signal path is shortened, and cooling efficiency is enhanced, and thus performance and integration density of a semiconductor circuit can be improved.

Although several embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A semiconductor module to connect to a main circuit board of an electronic system, comprising:
    a module substrate;
    a logic device formed on a part of the module substrate, wherein the logic device comprises:
        a package substrate;
        a logic chip mounted on the package substrate; and
        a package lid configured to cover the logic chip and formed on the package substrate, wherein the package lid comprises:
            an insulating lower portion; and
            a metallic upper portion; and
    a plurality of memory devices formed on another part of the module substrate, wherein the another part of the module substrate is perpendicular to the part of the module substrate, wherein the plurality of memory devices are disposed perpendicular to the logic device, and the module substrate on which the plurality of memory devices are formed is supported by a supporter, and wherein the module substrate is disposed on at least a first surface and a second surface of the supporter.

2. The module of claim 1, further comprising:
a heat transfer device mounted on the logic device.

3. The module of claim 2, wherein the supporter includes a metal, and is at least partially in physical contact with the heat transfer device.

4. The module of claim 1, wherein the memory devices are formed on a first surface and a second surface of the module substrate.

5. The module of claim 1, wherein the supporter has an end portion that is bent at a right angle.

6. The module of claim 1, wherein the supporter comprises:
a flat plate having at least one surface formed in a concavo-convex shape.

7. The module of claim 1, wherein the supporter includes a pillar that is disposed in a first or second direction.

8. The module of claim 1, wherein the memory devices are disposed on at least two sides of the module substrate and are respectively spaced from at least two surfaces of the logic device.

9. The module of claim 1, wherein the logic device is in physical contact with the supporter.

10. A semiconductor module to connect to a main circuit board of an electronic system comprising:
a module substrate;
a logic device formed on a part of the module substrate; and
a plurality of memory devices formed on another part of the module substrate, wherein the another part of the module substrate is perpendicular to the part of the module substrate, and wherein the plurality of memory devices are disposed perpendicular to the logic device, and the module substrate on which the plurality of memory devices are formed is supported by a supporter, wherein the module substrate is disposed on at least a first surface and a second surface of the supporter.

11. The module of claim 10, wherein the memory devices are formed on the same surface of the module substrate.

* * * * *

UNITED STATES PATENT AND TRADEMARK OFFICE
CERTIFICATE OF CORRECTION

PATENT NO.        : 8,456,000 B2                                            Page 1 of 1
APPLICATION NO.   : 12/554173
DATED             : June 4, 2013
INVENTOR(S)       : Joong-Hyun Baek It is certified that error appears in the above-identified patent and that said Letters Patent is hereby corrected as shown below:

On the Title page, Item (73) Assignee: "Stanzione & Kim, LLP" should be changed to
-- Samsung Electronics Co., Ltd. --

Signed and Sealed this
Twenty-sixth Day of November, 2013

Margaret A. Focarino
*Commissioner for Patents of the United States Patent and Trademark Office*